(12) United States Patent
Sapp et al.

(10) Patent No.: US 8,792,080 B2
(45) Date of Patent: Jul. 29, 2014

(54) METHOD AND SYSTEM TO PREDICT LITHOGRAPHY FOCUS ERROR USING SIMULATED OR MEASURED TOPOGRAPHY

(75) Inventors: Brian Christopher Sapp, Hopewell Junction, NY (US); Choongyeun Cho, Hopewell Junction, NY (US); Lawrence A. Clevenger, Hopewell Junction, NY (US); Laertis Economikos, Hopewell Junction, NY (US); Bernhard R. Liegl, Hopewell Junction, NY (US); Kevin S. Petrarca, Hopewell Junction, NY (US); Roger Allan Quon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 526 days.

(21) Appl. No.: 13/014,803

(22) Filed: Jan. 27, 2011

(65) Prior Publication Data

US 2012/0194792 A1      Aug. 2, 2012

(51) Int. Cl.
*G03B 27/52* (2006.01)
*G03F 7/20* (2006.01)
*G03F 9/00* (2006.01)

(52) U.S. Cl.
CPC .......... *G03F 7/70641* (2013.01); *G03F 7/7065* (2013.01); *G03F 9/7026* (2013.01)
USPC .......................................................... 355/55

(58) Field of Classification Search
CPC .. G03F 7/70641; G03F 9/7026; G03F 7/7065

USPC ............................................................ 355/55
See application file for complete search history.

(56) References Cited

U.S. PATENT DOCUMENTS

| | | | |
|---|---|---|---|
| 5,960,107 | A | 9/1999 | Leroux |
| 6,501,532 | B2 | 12/2002 | Suzuki |
| 6,847,919 | B2 | 1/2005 | Zhang et al. |
| 6,885,429 | B2 | 4/2005 | Lyons et al. |
| 7,042,551 | B2 | 5/2006 | Ausschnitt |
| 7,081,948 | B2 | 7/2006 | Lyons et al. |
| 7,301,604 | B2 | 11/2007 | Lin et al. |
| 7,336,341 | B2 | 2/2008 | Mimotogi et al. |
| 7,642,019 | B2 | 1/2010 | Kim |
| 7,656,512 | B2 | 2/2010 | Mieher et al. |
| 7,746,484 | B2 | 6/2010 | Van De Vin et al. |
| 7,749,666 | B2 | 7/2010 | Gassner et al. |
| 2008/0131796 | A1* | 6/2008 | Werner et al. ................... 430/30 |
| 2009/0262320 | A1 | 10/2009 | Staals et al. |
| 2010/0119961 | A1 | 5/2010 | Ye et al. |

OTHER PUBLICATIONS

Liegl, B. et al.; Predicting and reducing substrate induced focus error; Optical Microlithography XXIII; Proceedings of the SPIE, vol. 7640, pp. 76400Z-76400Z-12; 2010.

* cited by examiner

*Primary Examiner* — Chia-how Michael Liu
(74) *Attorney, Agent, or Firm* — Yuanmin Cai; Howard M. Cohn

(57) ABSTRACT

A method and system to predict lithography focus error using chip topography data is disclosed. The chip topography data may be measured or simulated topography data. A plane is best fitted to the topography data, and residuals are computed. The residuals are then used to make a prediction regarding the focus error. The density ratio of metal to dielectric may also be used as a factor in determining the predicted focus error.

11 Claims, 10 Drawing Sheets

METHOD AND SYSTEM TO PREDICT LITHOGRAPHY FOCUS ERROR USING SIMULATED OR MEASURED TOPOGRAPHY

FIELD OF THE INVENTION

The present invention relates generally to semiconductor fabrication, and more particularly, the present invention relates to lithographic processes used in semiconductor fabrication.

BACKGROUND OF THE INVENTION

Conventional optical projection lithography has been the standard silicon patterning technology for many years. It is an economical process due to its inherently high throughput, thereby providing a desirable low cost per part or die produced. A considerable infrastructure (including steppers, photomasks, resists, metrology, etc.) has been built up around this technology.

In this process, a mask, or "reticle", includes a device pattern formed of an opaque material, such as chrome, on a transparent or semitransparent substrate. The transmission of the opaque material may also vary, such as in the case of an attenuating phase shift mask. The device pattern of the reticle can be transferred to a photoresist film using imaging techniques well known in the art. For example, a stepper that includes a light source and optics that project light coming through the reticle can be used to image the device pattern, often with, for example, a 4× to 5× reduction factor, onto a photoresist film. The photoresist can then be developed and used as a mask pattern for processing the device, as is well known in the art.

In photolithography, failing to achieve acceptable focus of the pattern during the imaging process can result in pattern defects, which can translate into device defects and possibly device failure. In some cases, the chip design itself can induce focus error. When the focus error is unacceptably high, a chip redesign may be necessary, which is a costly and time-consuming endeavor. Therefore, it is desirable to have a method and system for predicting lithography focus error that reduces the need for chip redesign.

SUMMARY OF THE INVENTION

In one embodiment of the present invention, a method is provided for predicting lithography focus error for a chip. The method comprises computing a focal plane that best fits a subset of chip topography data. Then, a minimal local residual of the focal plane is computed. Next, a total focus error value is updated with the minimal local residual. Next, a new subset of chip topography data is acquired. These steps then repeat until each data point within the chip topography data is considered in at least one subset, resulting in the computation of a focus error value for the chip. Once each data point is considered in at least once subset, there is no need to acquire a new subset of chip topography data.

In another embodiment of the present invention, a system is provided for predicting lithography focus error for a chip. The system comprises a processor and non-volatile memory. The processor is configured and disposed to read executable instructions from the non-volatile memory. When these instructions are executed by the processor, the system performs various computational steps. First, a focal plane that best fits a subset of chip topography data is computed. Next, a minimal local residual of the focal plane is computed. In one embodiment, a least squares fit is used. Next, a total focus error is updated with the minimal local residual. In one embodiment, this is done with a moving average. Then, a new subset of chip topography data is acquired. These steps are then repeated until each data point within the chip topography data is considered in at least one subset, at which point, the total focus error is the focus error value for the chip.

DETAILED DESCRIPTION

Topography refers to the variation in height (Z) above the surface of a substrate. In semiconductor fabrication, typically a planarization step, such as a chemical mechanical polish (CMP) is performed to make the surface of the substrate smooth, such that a subsequent layer of the semiconductor can be formed. Typically, the first step in forming a layer of a multilayer integrated circuit (IC) is deposition of a mask layer, followed by a patterning step. Regions of the mask are cured via a lithographic process. Lithography tools focus an image onto the mask layer to cure a portion of the mask, while other parts of the mask remain uncured. The result is a pattern that is used in formation of subsequent layers used in the semiconductor fabrication process. Ideally, the planarization step makes the substrate completely smooth. However, in practice, there are variations in height (Z variations) due in part to the differing material characteristics of the various materials (e.g. polysilicon, metal, dielectric) undergoing the CMP process. If these Z variations are too great, then parts of the substrate will lie outside the focal plane of the lithography tool, which could result in patterning errors. If these errors are discovered after reticles have been created, the cost of such an error is quite high, as it may result in the need for a new reticle. It is therefore desirable to detect such a condition during the design stage of a chip, rather than in the fabrication stage. By detecting it in the design stage, it allows the possibility for design modification prior to making reticles, thereby saving considerable time and money.

Figure 1:
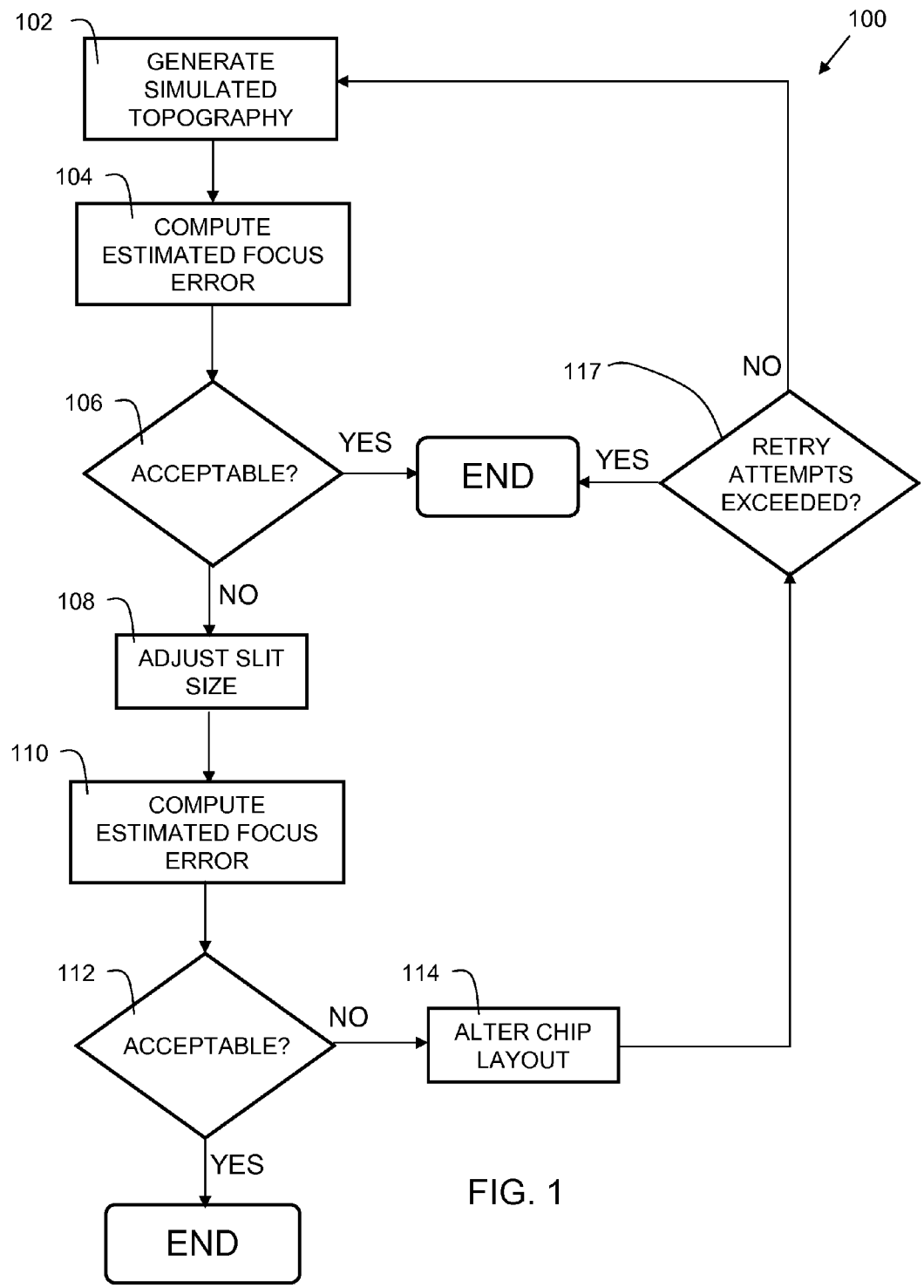
FIG. 1 is a flowchart indicating process steps in accordance with an embodiment of the present invention.

FIG. 1 is a flowchart 100 indicating process steps in accordance with an embodiment of the present invention. In process step 102, simulated topography data is generated. This data represents a plurality of x-y-z data points that together represent the height of the substrate at various points on a chip, relative to a base Z (height) reference level. In one embodiment, this data is received from the output of a CMP simulation process. In process step 104, the estimated focus error is computed. This is done by computing a focal plane that best fits the topography data, and setting the focal plane such that the residual (error) is minimized. In one embodiment, computing the focal plane that best fits a subset of the chip topography data comprises computing a best fit plane that minimizes the maximum distance from the points to the plane. In another embodiment, a best fit plane is computed that minimizes the sum of squared distances to the plane. In another embodiment, a least squares fit is used to compute the focal plane. In a specific embodiment, a least squares fit regression plane is computed, in which case X and Y values are fixed, and the measured error is in the Z dimension alone.

The focus error is then compared against a predetermined threshold in step 106 to determine if the estimated focal error is at an acceptable level. A criterion for acceptability includes the CD (critical dimension) for the particular layer. The CD is the size of the smallest feature on the layer. The CD varies with the acceptability level. For example, if the CD is 75 nm (nanometers), there is a higher acceptable limit of focal error than in the case of a CD of 40 nm. If the focus error is acceptable, the process ends.

One of the inputs to the focus error estimation is a slit size. The slit size (aperture size) controls the amount of light irradiated onto the substrate during the patterning process. The slit size controls a tradeoff between exposure times and focus. If the estimated focal error is not acceptable, based on the CD, then a different slit size may be used to perform the simulated focus error calculation. The slit size refers to the slit size used in a scanning lithography tool. If the focal error is unacceptable with a particular slit size, then another slit size can be used as input to the focus error simulation in process step 110. While any slit size can be used in a simulation, in practice, the variation in slit size is a function of the lithography tool. Hence, it is contemplated that for practical purposes, the variation in slit size used for the simulations is within the range of the possible slit sizes for a particular lithography tool.

In process step 112, the resulting focus error from process step 110 is compared against the predetermined threshold similar to that of process step 106. If the focus error is acceptable, the process ends. If the focus error is not acceptable, the chip layout is altered in process step 114. The layout alteration may include modifying the position of one or more functional areas ("chiplets") within the chip to reduce the Z variation. The process then repeats, with a new simulated topography calculated in process step 102, based on the new layout data resulting from process step 114. In process step 117, the number of retry attempts is monitored, and if it exceeds a predetermined threshold, the process ends. In this case, a more thorough chip re-design may be needed to account for lithographic issues.

Figure 2:
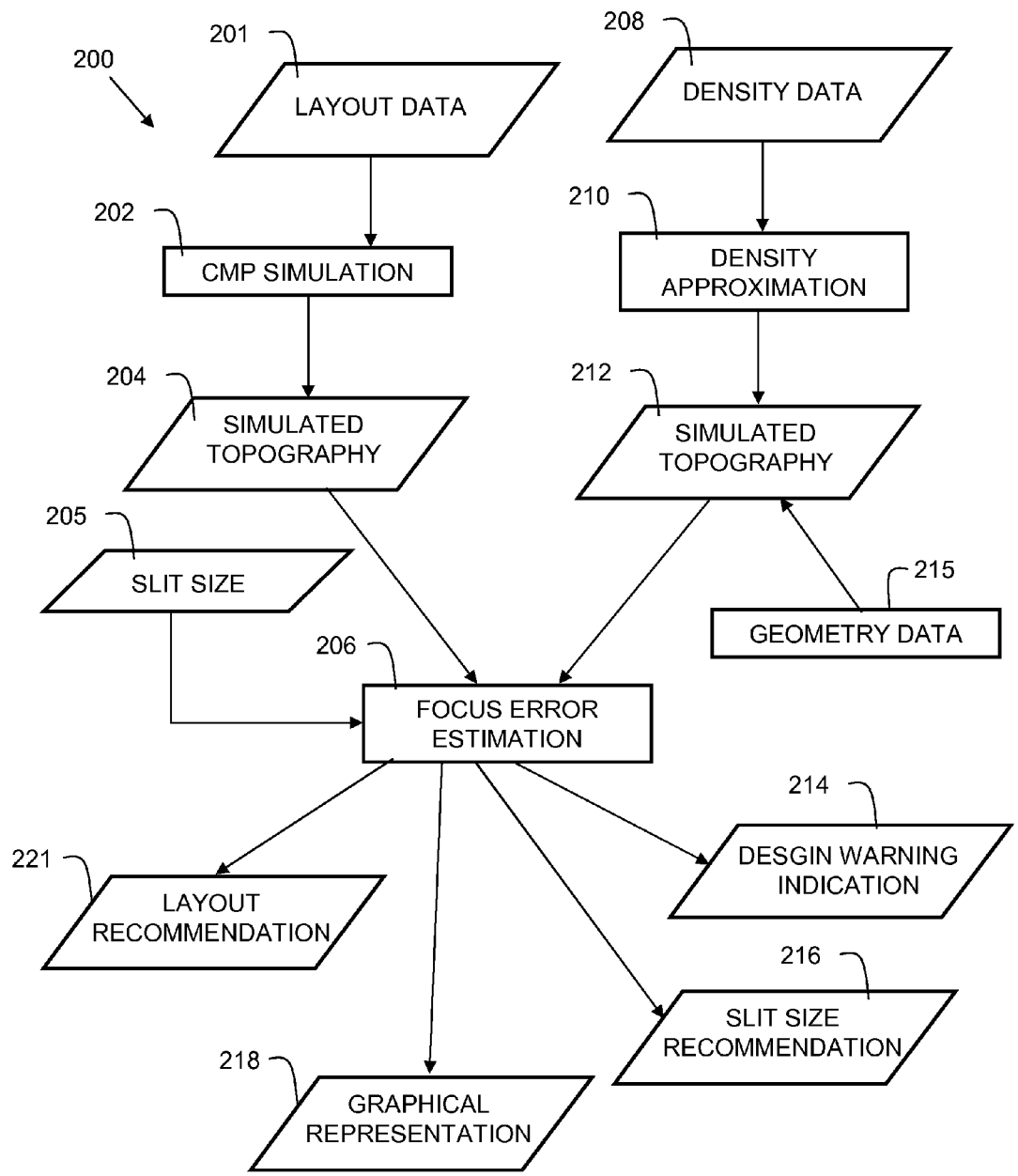
FIG. 2 is a block diagram indicating data flow in accordance with an embodiment of the present invention.

FIG. 2 is a block diagram 200 indicating data flow in accordance with an embodiment of the present invention. In one embodiment, layout data 201 is input to a CMP simulation process 202. Layout data 201 may comprise data in a format of GDSII or OASIS. Other formats may also be used. The output of CMP simulation process 202 is simulated topography data 204. Simulated topography data 204 is an input to the focus error estimation process 206, along with the slit size 205. The outputs of focus error estimation process 206 may include, but is not limited to, a graphical representation 218, a design warning indication 214, and a slit size recommendation 216.

As an alternative to obtaining the simulated topography from CMP simulation process 202, density data 208 is input into a density approximation process 210. Density approximation process 210 may comprise a database of empirical relationships between density and topography. In this context, density refers to the makeup of substrate materials at the surface within a particular logical area referred to as a "bounding region." A bounding region is typically quite small in comparison to the size of a chip. Hence, there may be many thousands or even millions of bounding regions within a chip. Within each bounding region, the makeup of materials is considered. The percentage of metal, dielectric, polysilicon, and other materials within the bounding region is contained within the density data 208. The density approximation process 210 outputs a simulated topography data set 212 based on the density data 208. That is, for each bounding region, an estimated Z (height) value is derived from the density (e.g. the metal density, such as the ratio of metal to dielectric) within that region, thereby forming the simulated topography data set 212. In addition to density data 208, geometry data 215 may also be considered when generating simulated topography data set 212. While in general, a density near the 50% area is preferable (e.g. approximately 50% metal and approximately 50% dielectric), geometry data may also be considered. Geometry data may include, but is not limited to, the width of metal lines. By taking the geometry into account, a more accurate simulation can be achieved.

For example, consider a case of alternating 25 micrometer metal lines and 25 micrometer spaces of dielectric, then the resulting density is 50% and good lithography results can be inferred. However, consider a second case of alternating 150 micrometer metal lines and 150 micrometer spaces of dielectric. In that case, the resulting density is still 50%. However, the wider lines are more prone to adverse CMP effects such as dishing, and hence an optimal lithography likely would not be achieved, even with the density at or near 50%. Hence, by considering both density and geometry, more accurate topology results may be achieved. In one embodiment, a width constraint may be used to prevent a simulated topography 212 that has features that are so large as to be prone to dishing.

Simulated topography data set 212 is then input to the focus error estimation process 206, and outputs 214, 216, and 218 may be output from the focus error estimation process 206 as described previously. Optionally, output 221 is provided, which is a chip layout recommendation for minimizing focus error. The layout recommendation is based on the best chip layout tried in process step 114 of FIG. 1.

Figure 3:
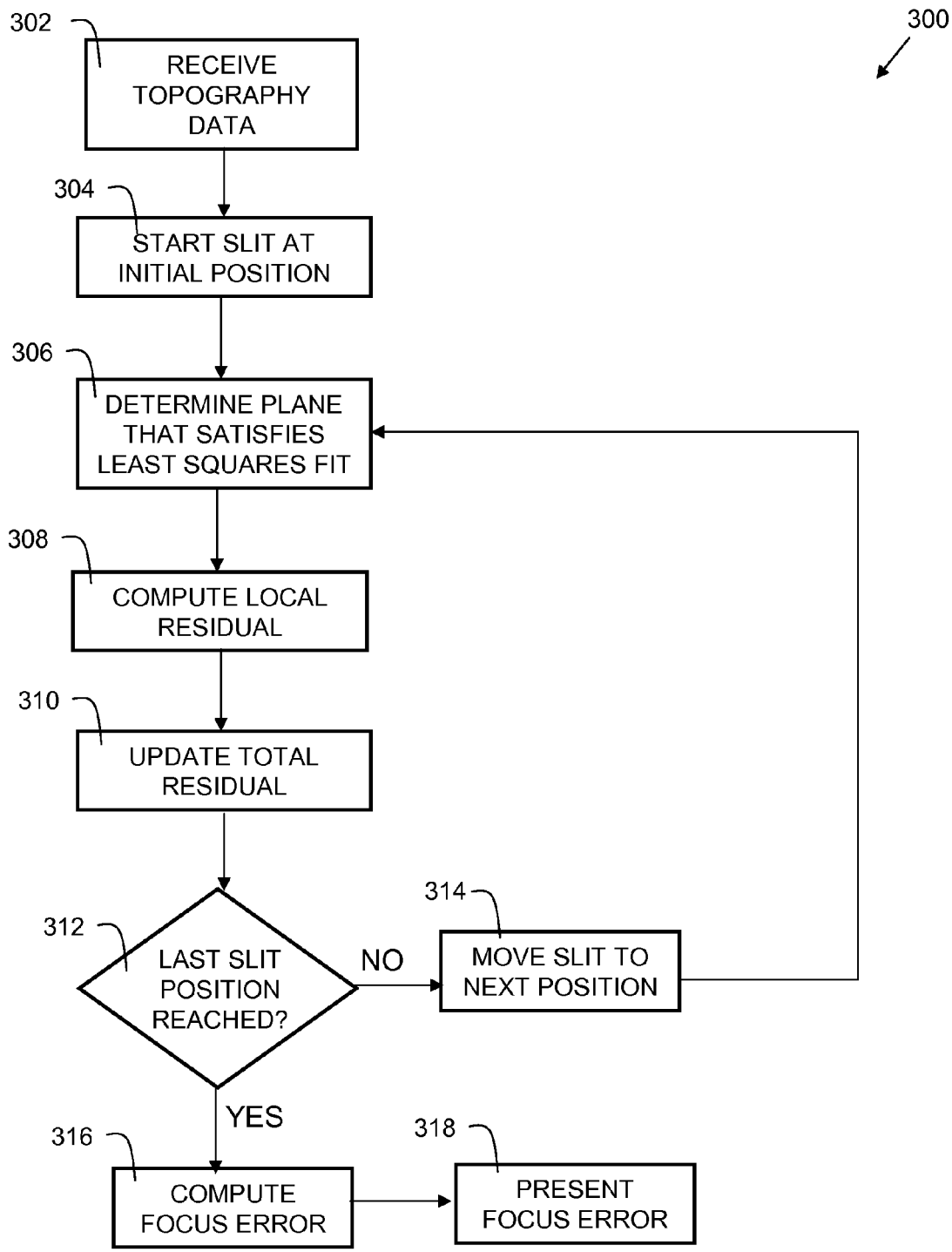
FIG. 3 is a flowchart indicating process steps in accordance with an embodiment of the present invention.

FIG. 3 is a flowchart 300 indicating process steps in accordance with an embodiment of the present invention. Flowchart 300 shows specific details of the focus error estimation process (see 206 of FIG. 2). In process step 302, topography data is received. In process step 304, a subset of topography data is considered, the size of which, is dependent on a slit size for a lithography tool. In process step 306, a plane that satisfies the least squares fit of the subset of topography data is computed. In process step 308, a local residual (error) is computed. In process step 310, a total residual (focus error) value is updated with the value of the local residual. In one embodiment, the total residual value is computed as a moving average of the local residuals. In process step 312 a check is made to determine if the last slit position has been reached. If the last list position has not been reached, then in process step 314, the slit is moved to the next position, which may entail shifting it by one pixel for each iteration. As this is a simulation process, there is no physical slit, but rather a selection of a new subset of topography data based on the slit size for a lithography tool. The process steps starting with 306 continue until the last slit position is reached, meaning that the entire exposure field has been encompassed within at least one subset of topography data represented by the slit. In process step 316, the focus error is computed as the total residual from step 310. In step 318 the focus error is presented to a user. The presentation may include, but is not limited to, a graphical representation of the error, and a textual representation of the error, which may further comprise a warning for the user if the focus error is determined to be unacceptably high at any location within the chip.

Figure 4:
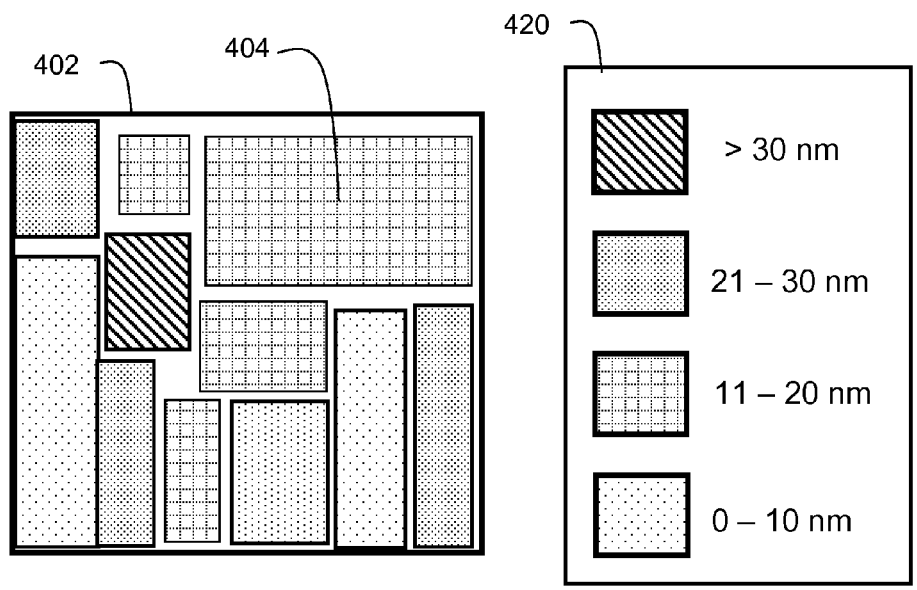
FIG. 4 is a graphical representation of focus error in accordance with an embodiment of the present invention.

FIG. 4 is a graphical representation of focus error in accordance with an embodiment of the present invention. A graphical region 402 represents an exposure field, which preferably includes an area corresponding to a chip on a wafer. In graphical region 402, different focus error ranges are represented by different indicia. Within the chip are a plurality of regions (indicated generally as 404, for illustrative clarity, only one such region is indicated with a reference number) and a legend 420 indicating the focus error pertaining to each region. In one embodiment, the unit of measurement for the focus error is nanometers. While different patterns are shown for various regions 404 in FIG. 4, it s also contemplated that different colors may be used to represent various levels of focus error instead of, or in addition to, the use of patterns.

Figure 5:
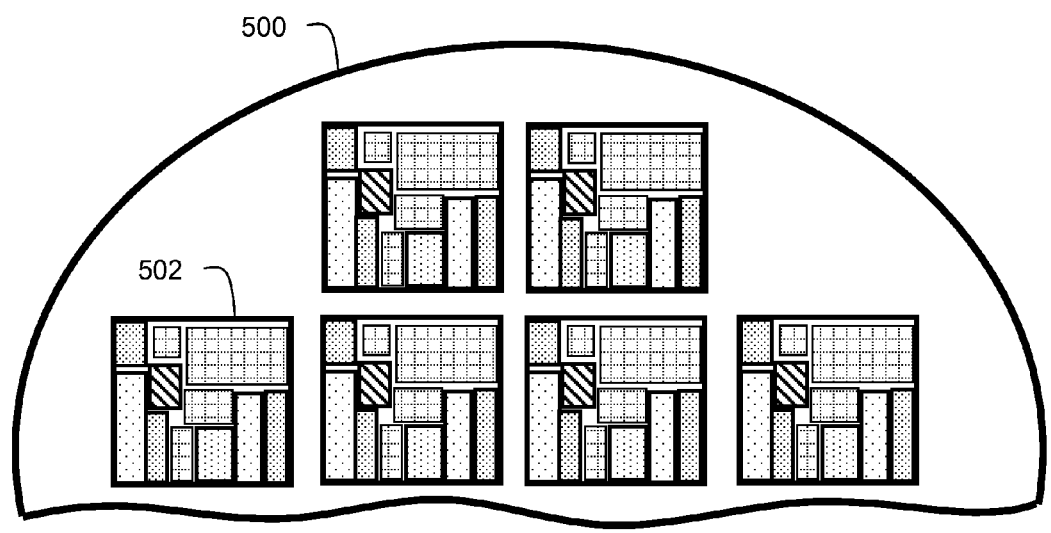
FIG. 5 is an additional graphical representation of focus error in accordance with an embodiment of the present invention.

FIG. 5 is an additional graphical representation of focus error in accordance with an embodiment of the present invention. A portion of a representation of a wafer 500 is shown in FIG. 5. The wafer representation 500 comprises a plurality of chip representations 502, each of which, are similar to 402 of FIG. 4. Note that while only a few chip representations 502 are shown in FIG. 5, in practice, there may be thousands of such chip representations shown within wafer representation 500. This graphical representation provides a way to identify recurring patterns of focus error within a wafer.

Figure 6A:
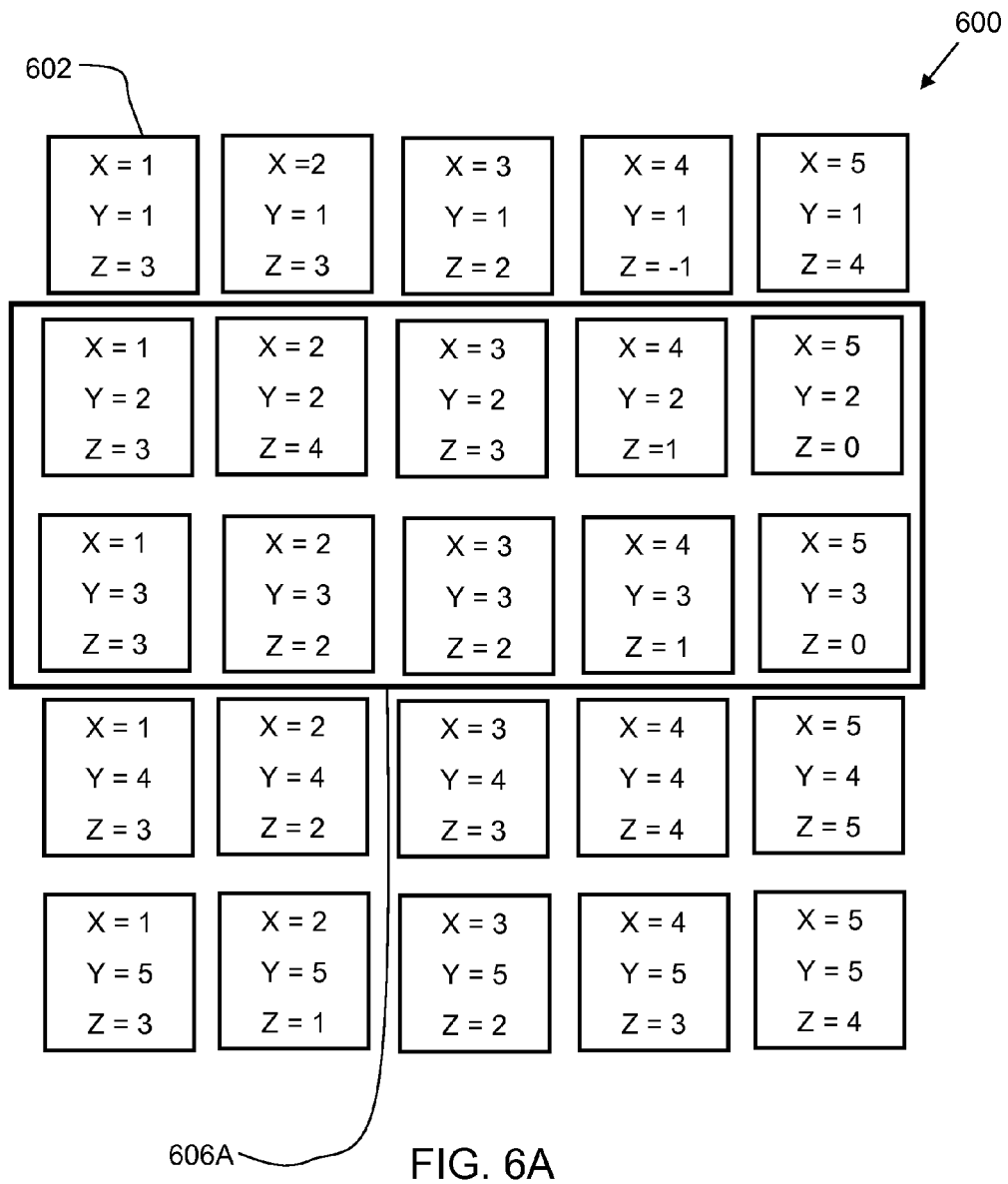
FIGS. 6A-6E show representations of simulated topography data.

FIG. 6A shows a representation of exemplary topography data 600. Topography data 600 comprises a plurality of data tuples ("data points"), indicated generally as 602. Each tuple includes, but is not necessarily limited to, an X coordinate, a Y coordinate, and a Z coordinate, where Z represents a height value above or below a base level of a semiconductor substrate. In the example shown in FIGS. 6A-6C, the data units are arbitrary. In practice, it is contemplated that nanometers or angstroms may be used. Slit 606A defines a subset of data tuples that will be used for performing a least squares error fit for the focal plane. As shown in FIG. 6A, the slit 606A encompasses the tuple <1,2, * >, where X=1, Y=2, and "*" represents any value for the Z dimension. The slit also encompasses the tuple <5, 3, *>. Hence, the slit 606A can be defined by the two endpoint tuples <1, 2, *> and <5, 3, *>. Note that while the slit 606A shown in FIG. 6A encompasses 10 tuples, in practice, there may be many thousands of tuples (data points) within the region defined by a slit. In another embodiment, the tuple may comprise a pair of X-Y coordinates that define an area referred to as a "tile." The Z value of the tuple may be the average Z (height) within the tile. Alternatively, the worst-case Z value for the tile may be used as the Z value of the tuple. In one embodiment, the tile size is a user-configurable parameter. For example, a tile size of 10 microns may yield more accurate results than a tile size of 50 microns, with the tradeoff being a longer execution time required to run the simulation for a smaller tile size.

Figure 6B:
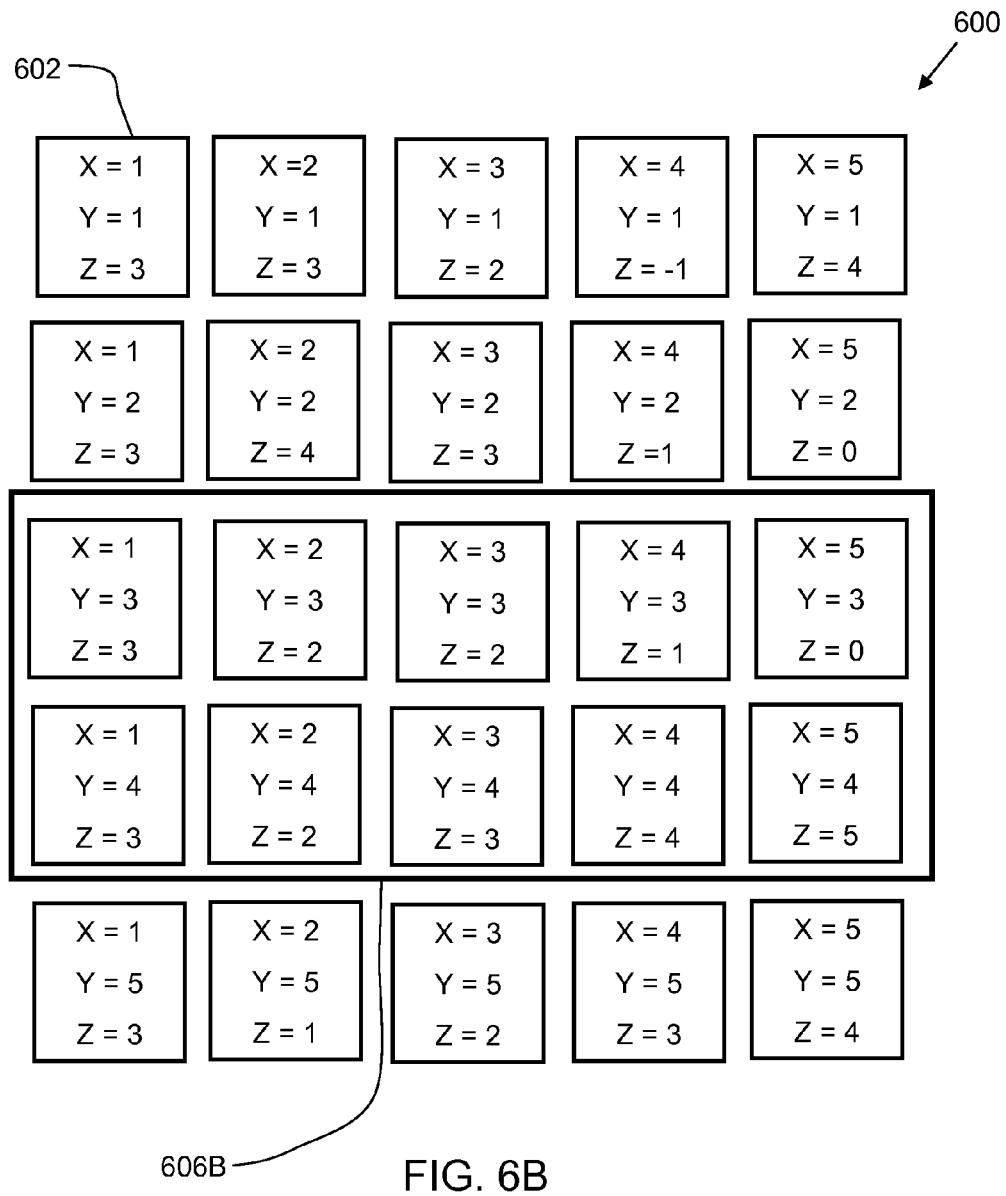

FIG. 6B shows the same topography data 600, but with the slit (indicated now as 606B) moved to its next position, now defined by endpoint tuples <1, 3, *> and <5, 4, *>. This new slit position corresponds to process step 314 shown in FIG. 3. The subset of tuples defined by slit 606B are then used for performing a least squares error fit for the focal plane. This procedure is repeated as the slit is moved "over" the entire set of topography data tuples (data points).

Figure 6C:
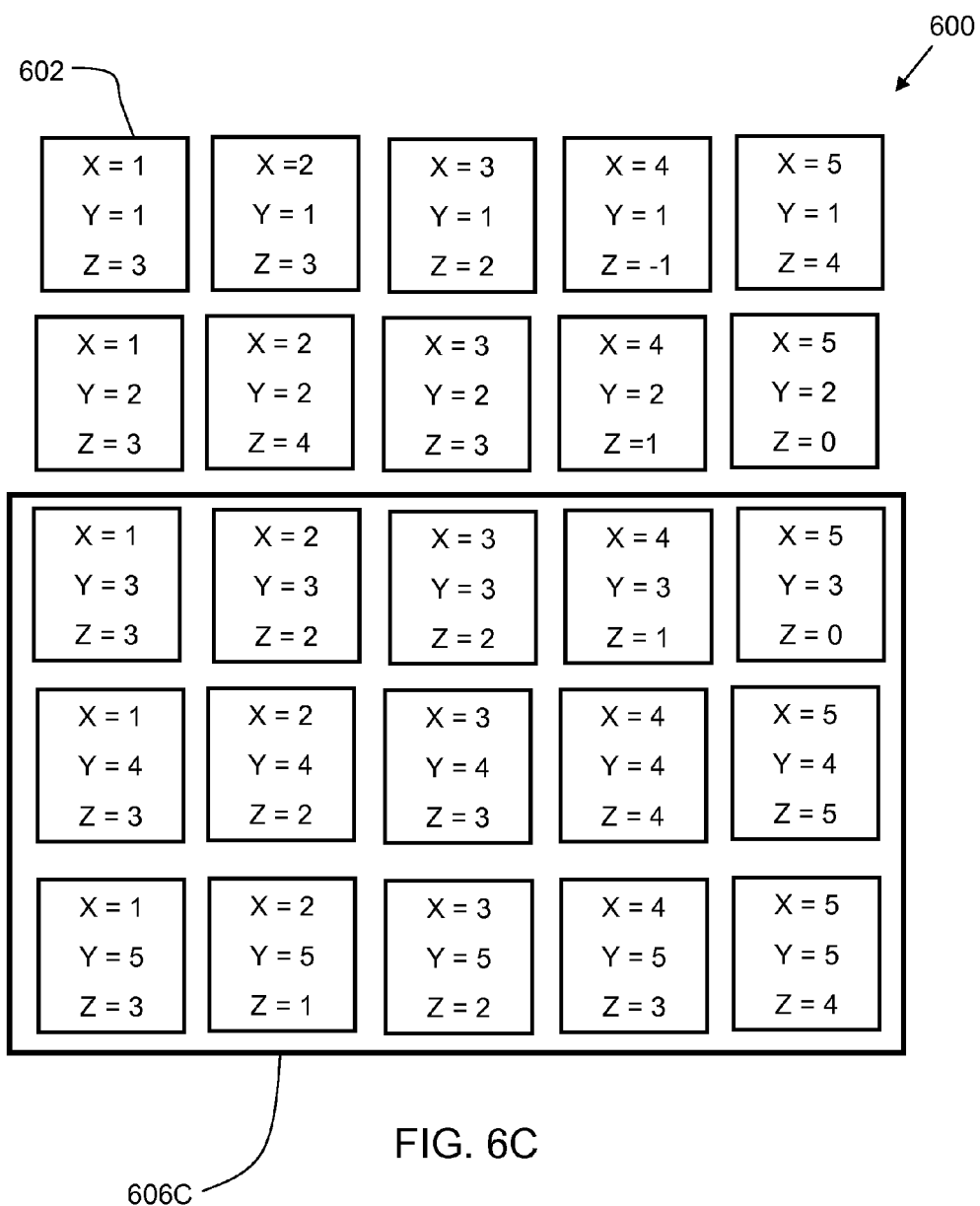

FIG. 6C shows the same topography data 600, but with the slit (indicated now as 606C) of a different size than slit 606A (see FIG. 6A). In this case, slit 606C is larger than slit 606A of FIG. 6A. Slit 606C is defined by the two endpoint tuples <1, 3, *> and <5, 5, *>.

Changing a slit from 606A to 606C corresponds to process step 108 in FIG. 1. In many cases, it may be preferable to use a different slit size, which is a tool reconfiguration, if doing so can avoid unacceptable focus error, and also avoid the need to alter the chip layout.

Figure 6D:
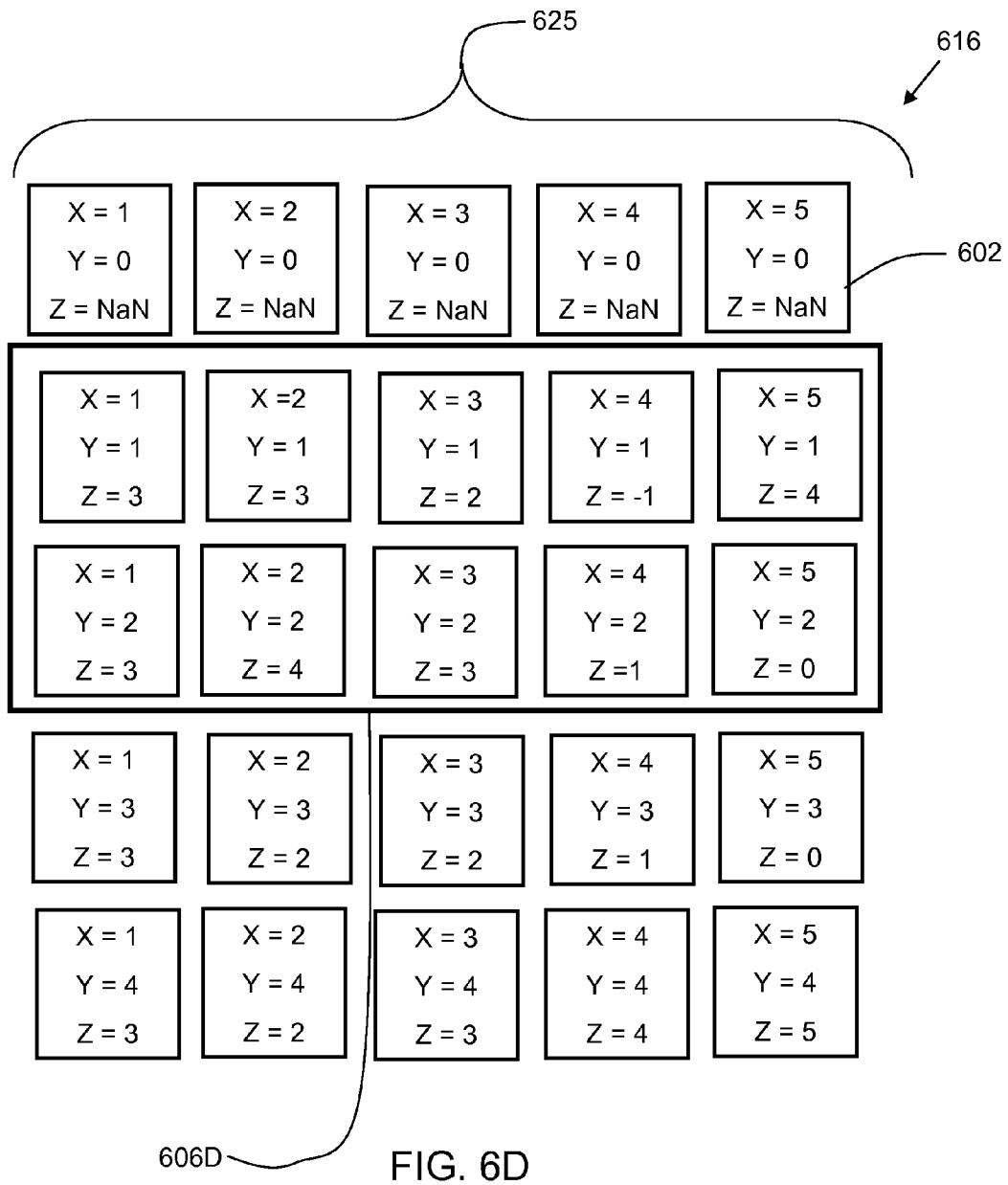

FIG. 6D shows a representation of exemplary topography data 616. In this figure, compensation for boundary conditions is shown, as slit 606D is at the topmost part of the chip (top chip boundary). When fitting a plane near the boundaries of a chip, a synthesized topology dataset can be used to enable consistent plane-fitting calculations. In FIG. 6D, the top row (Y=0) comprises synthesized topology dataset 625. In this case, the Z value for the synthesized topology dataset is set to "not a number" (NaN). NaNs are part of the IEEE 754 floating-point standard, and are used to enable calculations that require particular sized matrices when insufficient real data exists. For example, math computation programs such as MATLAB can utilize the NaN entries in the synthesized topology dataset 625 to perform plane fitting at the boundaries.

Figure 6E:
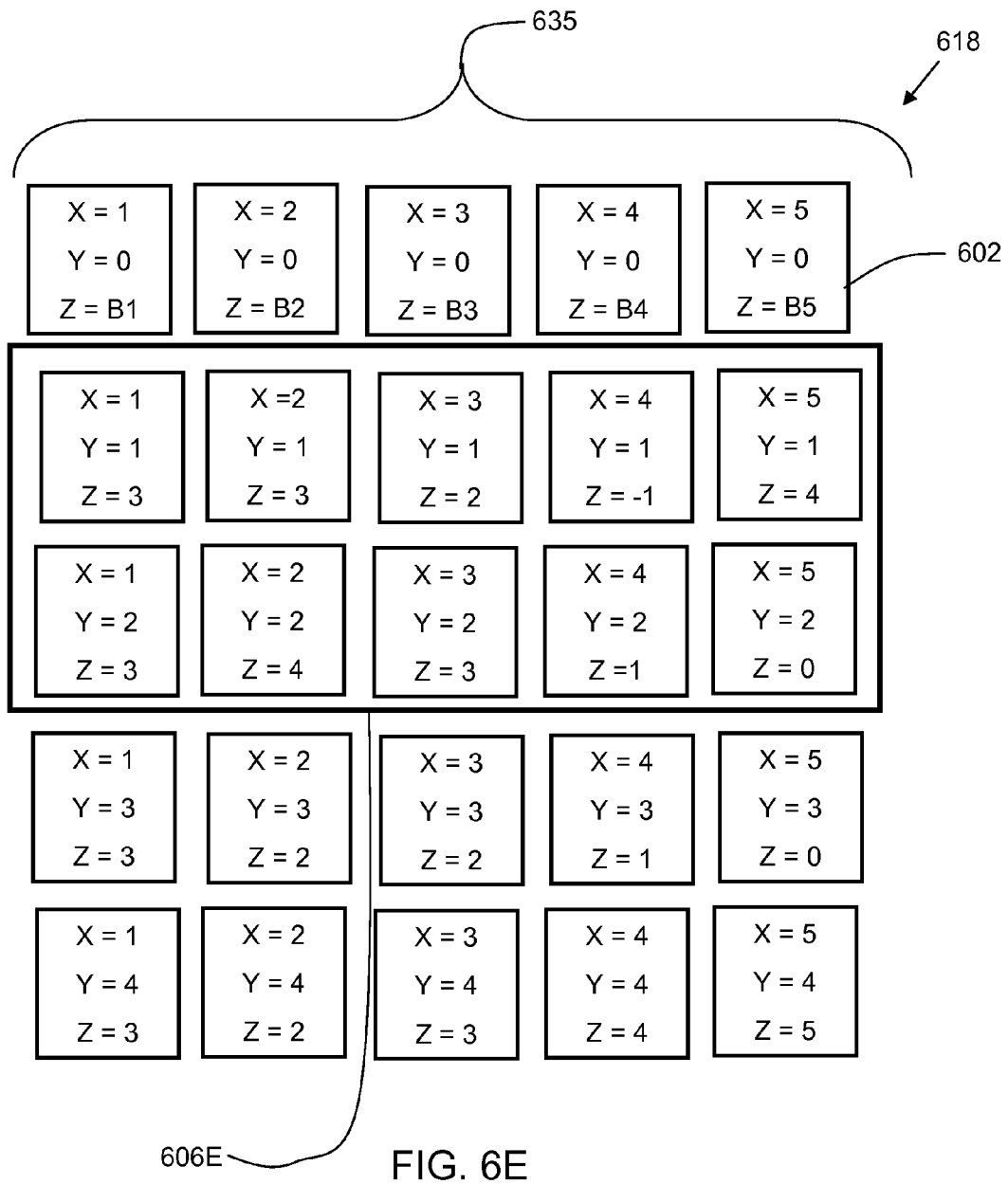

FIG. 6E shows a representation of exemplary topography data 618. In this figure, an alternative method for compensation for boundary conditions is shown. When fitting a plane near the boundaries of a chip, a synthesized topology dataset 635 is used to enable consistent plane-fitting calculations. However, instead of using NaN like dataset 625 of FIG. 6D, synthesized topology dataset 635 uses estimated Z values (indicated as B1, B2, B3, B4, and B5). In practice, the values B1-B5 may be set to expected values as if another identical chip was present at that location. Hence, the synthesized topology dataset comprises values from areas opposite the location of the slit 606E. For example, in a boundary at the top of a chip, the Z values (B1-B5) may represent Z data at the bottom of that chip, since if additional identical chips are simulated around a particular chip, the bottom of one chip may be adjacent to the top of the chip undergoing the simulation.

Figure 7:
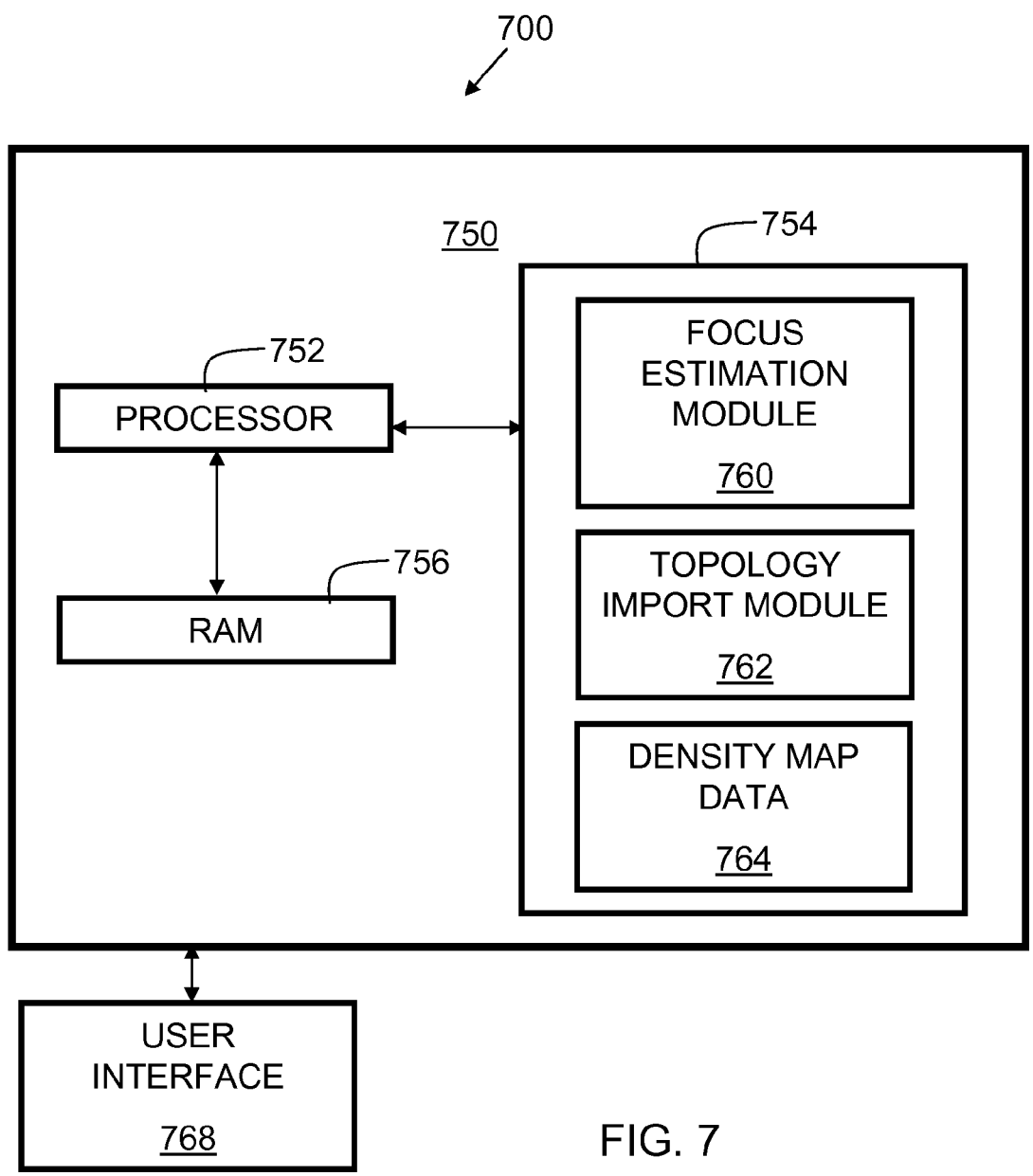
FIG. 7 is a block diagram of a system in accordance with an embodiment of the present invention.

FIG. 7 shows a block diagram of a system 700 in accordance with an embodiment of the present invention. System 700 comprises a computer system 750 which comprises microprocessor 752, Random Access Memory (RAM) 756, and non-volatile memory (NV-MEM) 754. NV-MEM 754 comprises machine instructions, which may be organized into a plurality of modules. These modules may include, but are not limited to, focus estimation module 760, topology import module 762, and density map data 764. Alternatively, all or part of these modules may be stored using another technology, such as a magnetic or optical disk drive, without departing from the scope and purpose of the present invention. User interface 768 may comprise, but is not limited to, a keyboard, a mouse, trackball, or other selection device, and a display for presenting the focus error information to a user.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for predicting lithography focus error for a chip by analyzing chip topography data, comprising:
   a) computing a focal plane that best fits a subset of the chip topography data;
   b) computing a minimal local residual of the focal plane;
   c) updating a total focus error value with the minimal local residual;
   d) acquiring a new subset of chip topography data based on chip density data and geometry data, wherein the chip density data comprises the makeup of substrate materials at the surface within a logical area, and wherein the geometry data comprises the width of metal lines; and
   repeating steps a), b), c), and d) until each data point within the chip topography data is considered in at least one subset, wherein step d) is not repeated on the last iteration, thereby computing a focus error value for the chip.

2. The method of claim 1, further comprising:
   changing the size of the subset of chip topography data, and repeating steps a), b), c), and d), and identifying a subset size that results in a minimized focus error, wherein the subset size is representative of a slit size, wherein step d) is not repeated on the last iteration.

3. The method of claim 1, further comprising:
   changing the chip layout, receiving updated chip topography, the updated chip topography representative of the changed chip layout, and repeating steps a), b), c), and d), and identifying a chip layout that results in a minimized focus error, wherein step d) is not repeated on the last iteration.

4. The method of claim 1, wherein the chip density data comprises the ratio of metal to dielectric material for a region within the chip.

5. The method of claim 4, further comprising:
   deriving the chip topography data from a CMP simulation.

6. The method of claim 1, further comprising:
   providing a graphical region representing an exposure field, wherein different focus error ranges are represented by different indicia.

7. The method of claim 6, wherein the indicia comprise different patterns.

8. The method of claim 6, wherein the indicia comprise different colors.

9. The method of claim 1, further comprising:
   providing a graphical region representing a wafer representation, wherein the wafer representation comprises a plurality of exposure field images, wherein each of the exposure field images indicates different focus error ranges as represented by different indicia.

10. The method of claim 1, wherein the subset of chip topography data comprises a synthesized topology dataset.

11. The method of claim 10, wherein the synthesized topology dataset comprises not-a-number entries.

* * * * *